US012805291B2

(12) United States Patent
Sharma et al.

(10) Patent No.: US 12,805,291 B2
(45) Date of Patent: Nov. 17, 2026

(54) FULL WAFER DEVICE WITH FRONT SIDE PASSIVE ELECTRONIC COMPONENTS WITH A SEAM EXTENDING THROUGH A PASSIVE ELECTRONIC COMPONENT

(71) Applicant: Intel Corporation, Santa Clara, CA (US)

(72) Inventors: Abhishek A. Sharma, Hillsboro, OR (US); Tahir Ghani, Portland, OR (US); Wilfred Gomes, Portland, OR (US); Anand S. Murthy, Portland, OR (US); Pushkar Sharad Ranade, San Jose, CA (US); Sagar Suthram, Portland, OR (US)

(73) Assignee: Intel Foundry IP LLC, Santa Clara, CA (US)

( * ) Notice: Subject to any disclaimer, the term of this patent is extended or adjusted under 35 U.S.C. 154(b) by 179 days.

(21) Appl. No.: 17/930,825

(22) Filed: Sep. 9, 2022

(65) Prior Publication Data

US 2024/0088017 A1 Mar. 14, 2024

(51) Int. Cl.

| | |
|---|---|
| ***H10W 20/42*** | (2026.01) |
| ***H10D 1/20*** | (2025.01) |
| ***H10D 1/47*** | (2025.01) |
| ***H10D 1/68*** | (2025.01) |
| ***H10W 20/00*** | (2026.01) |
| ***H10W 20/40*** | (2026.01) |

(52) U.S. Cl.

CPC .............. *H10W 20/42* (2026.01); *H10D 1/20* (2025.01); *H10D 1/47* (2025.01); *H10D 1/68* (2025.01); *H10W 20/081* (2026.01); *H10W 20/496* (2026.01); *H10W 20/497* (2026.01); *H10W 20/498* (2026.01)

(58) Field of Classification Search

CPC .................................................. H01L 23/5226

USPC .......................................................... 257/531

See application file for complete search history.

(56) References Cited

U.S. PATENT DOCUMENTS

2010/0309605 A1* 12/2010 Lin ..................... H01L 23/5223
361/306.3

2020/0152855 A1* 5/2020 Lin ....................... H01F 27/306

FOREIGN PATENT DOCUMENTS

JP 2010034483 A * 2/2010

* cited by examiner

*Primary Examiner* — Ajay Arora

(74) *Attorney, Agent, or Firm* — Akona IP PC

(57) ABSTRACT

Described herein are full wafer devices that include passive devices formed in one or more interconnect layers. Interconnect layers are formed over a front side of the full wafer device. A passive device is formed using an additive process that results in a seam running through the passive device. The seam may be, for example, an air gap, a change in material structure, or a region with a different chemical makeup from the surrounding passive device. In some embodiments, the passive devices are formed in global interconnect layers coupling multiple does of the full wafer device.

20 Claims, 12 Drawing Sheets

FULL WAFER DEVICE WITH FRONT SIDE PASSIVE ELECTRONIC COMPONENTS WITH A SEAM EXTENDING THROUGH A PASSIVE ELECTRONIC COMPONENT

BACKGROUND

For the past several decades, the scaling of features in ICs has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each IC die and each IC package that includes one or more dies becomes increasingly significant.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1A:
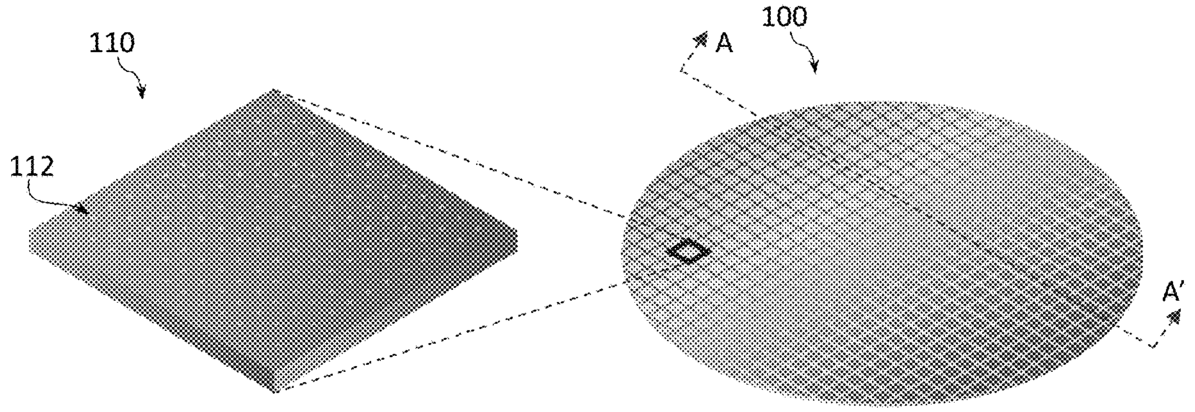
FIGS. 1A and 1B illustrate example perspective views and side views of dies formed over a wafer, according to some embodiments of the present disclosure.

In traditional semiconductor processing, multiple dies are formed over the surface of a semiconductor wafer. Each of the dies may be a repeating unit of a semiconductor product, such as an integrated circuit (IC) device. Typically, after the ICs are formed in the dies, the wafer undergoes a singulation process in which each of the dies is separated from one another to provide discrete "chips" of the IC device.

To achieve greater computational power, multiple dies can be packaged together and interconnected. Wafer-scale integration can be used to interconnect all of the dies on a wafer, forming a very powerful device, such as a supercomputer. A device that uses the full wafer can also be referred to as a full wafer engine or full wafer device. In some cases, circuitry arranged as multiple dies is fabricated on a wafer. Rather than singulating the dies, additional layers of interconnect are formed over the dies to connect the individual dies together, forming a full wafer device.

Due to manufacturing constraints, it can be challenging to produce a wafer in which each of the dies is not defective. In generating high-density circuits with increasingly small features, it is typical for a portion of the resulting dies to have some flaws. As an alternative to using a full, processed wafer, multiple singulated dies may be bonded to a wafer. The dies may be tested before bonding to the wafer to ensure functionality of each of the dies in the final device. Interconnect circuitry can then be fabricated over this assembly of dies to connect the individual dies together.

In addition to active semiconductor devices (e.g., transistors), IC devices may include passive structures, such as resistors, capacitors, and/or inductors. For example, resistors and capacitors may be incorporated in an IC package to reduce electromagnetic interference (EMI) and/or suppress electrostatic discharge (ESD). Passive devices may also be included for power delivery. Passive devices are typically fabricated using subtractive processing, in which a material for forming a passive structure is deposited and patterned, and a portion of the material is etched away, leaving the passive structure behind on the device. This etch-based process can create non-linearities in the electrical properties of the resulting passive devices.

Embodiments of the present disclosure may improve on at least some of the challenges and issues described above by providing wafer-scale devices with passive devices formed using an additive process. The additive process for forming the passive devices may result in a seam that can be observed in a cross-section of the passive device. The passive devices may be formed on a front side of a compute layer of a full-wafer device. In some embodiments, a passive device may be formed within a global interconnect layer that couples together multiple dies of the full-wafer device. In other embodiments, the passive device may be formed in a local interconnect layer specific to a particular die of the full-wafer device. In such embodiments, many passive devices may be formed across the device, e.g., one or more passive devices in each die; seams may be observed in all or some portion of the passive devices in the device.

A seam may form during the additive process in which the passive devices are formed. To fabricate a passive device, a layer of an insulator material is formed (e.g., deposited)

across a device (e.g., over a die or across a wafer), and the insulator material is patterned. A portion of the insulator material is etched, and a material for forming the passive device (e.g., a metal or other conductive material) is deposited into the etched areas using a conformal deposition process. Multiple layers of the insulator material may be deposited and patterned prior to etching, such that a second layer of insulator is present over a first layer containing the passive device prior to etching the patterned insulator in the first layer and depositing the conductive material. This second layer of insulator forms a top of the passive device. In addition, vias may be formed in the second layer; the conductive material for forming the passive device enters the first layer through the vias.

The seam is a discontinuity in the conductive material forming the passive device. As one example, the seam is an air gap between a lower portion of the passive device (e.g., a portion closer to a support structure) and an upper portion of the passive device (e.g., a portion farther from the support structure). As another example, the seam is a discontinuity in the material structure (e.g., crystal structure or grain structure) between the lower portion and upper portion of the passive device. As yet another example, the seam is a chemical difference between the lower portion and the upper portion of the passive device, or the seam has a different chemical composition than other portions of the passive device (e.g., a different percentage of oxygen, nitrogen, or another element from surrounding regions of the passive device).

In the following, some descriptions may refer to a particular S/D region or contact being either a source region/contact or a drain region/contact. However, unless specified otherwise, which region/contact of a transistor is considered to be a source region/contact and which region/contact is considered to be a drain region/contact is not important because, as is common in the field of FETs, designations of source and drain are often interchangeable. Therefore, descriptions of some illustrative embodiments of the source and drain regions/contacts provided herein are applicable to embodiments where the designation of source and drain regions/contacts may be reversed.

As used herein, the term "metal layer" may refer to a layer above a support structure that includes electrically conductive interconnect structures for providing electrical connectivity between different IC components. Metal layers described herein may also be referred to as "interconnect layers" to clearly indicate that these layers include electrically conductive interconnect structures which may but does not have to be metal.

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a memory cell may refer to one of a finite number of states that the cell can have, e.g., logic states "1" and "0," each state represented by a different voltage of the capacitor of the cell, while "READ" and "WRITE" memory access or operations refer to, respectively, determining/sensing a logic state of a memory cell and programming/setting a logic state of a memory cell. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 10A-10B, such a collection may be referred to herein without the letters, e.g., as "FIG. 10."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with stacked memory devices as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example Wafer Device with Multiple Dies

Figure 13:
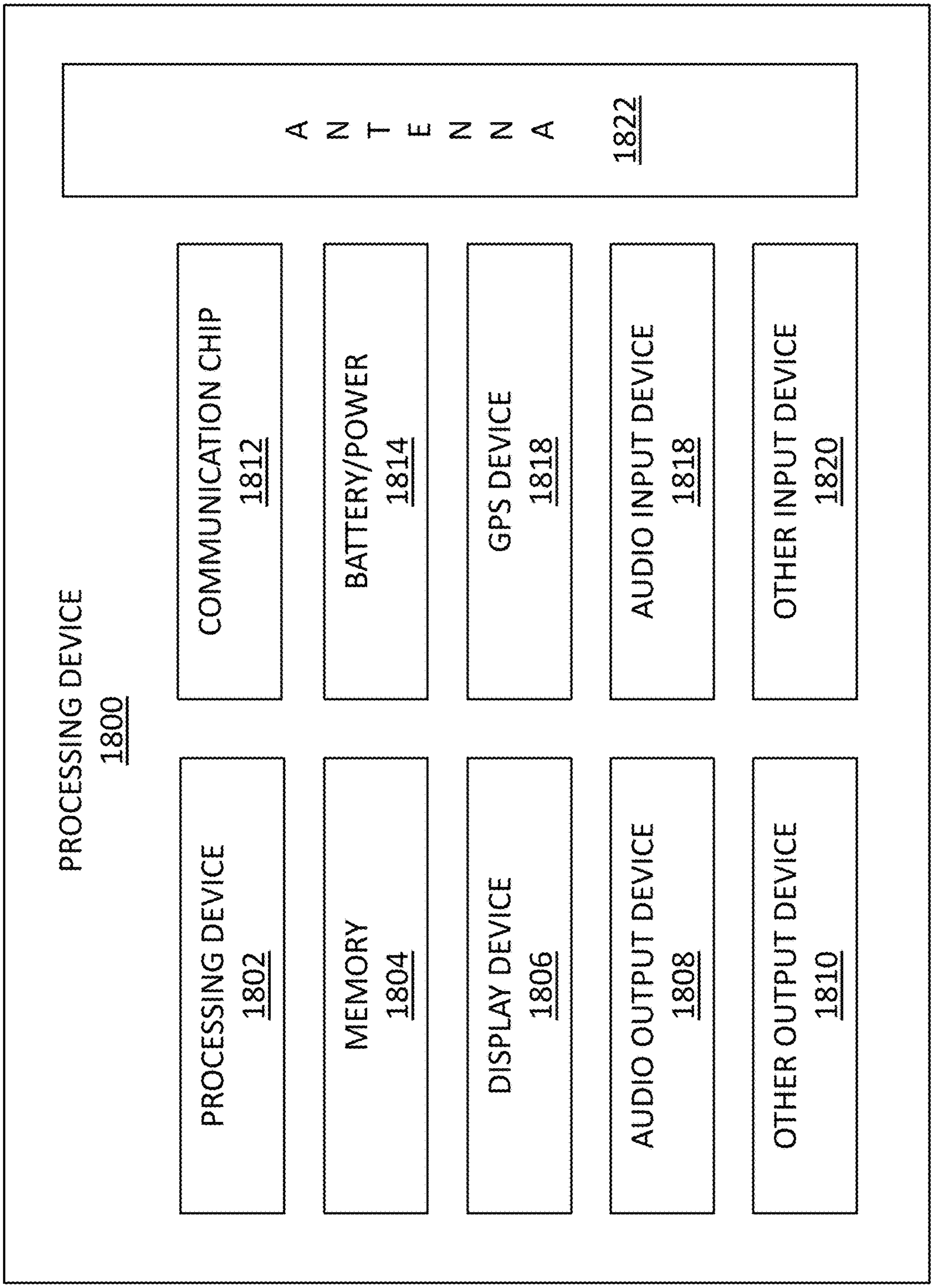
FIG. 13 is a block diagram of an example computing device that may include one or more passive devices in accordance with any of the embodiments disclosed herein.

FIGS. 1A and 13 illustrate example perspective views and side views of dies formed over a wafer, according to some embodiments of the present disclosure. The wafer 100 may be generally circular or approximately circular. As described herein and illustrated in FIGS. 3-9, the wafer 100 may include one or more passive devices, e.g., resistors, inductors, and/or capacitors. A passive device may be formed using an additive process that results in a seam in a cross section of the device, as described with respect to FIGS. 5-9.

The wafer 100 may be composed of semiconductor material and include multiple dies having IC structures formed on a surface of the wafer 100. One of the dies 110 is labelled and enlarged in FIG. 1A, but a plurality of similar dies are shown to be arranged in a grid-like manner across the wafer 100. Each of the dies of the wafer 100 may be a repeating unit of a semiconductor product that includes any suitable IC. The dies 110 may include semiconductor devices for implementing computing logic, e.g., transistors and/or capacitors. Individual dies 110 may further include circuitry for connecting these devices, e.g., interconnect circuitry that may include lines (or trenches) and vias. The interconnect circuitry is typically formed from conductive materials, and may be formed in one or more interconnect layers, also referred to as metal layers. Within a given die, the interconnect layers are referred to herein as local interconnect layers, meaning that the interconnect structures are local to a die 110, rather than extending between multiple dies. The semiconductor devices may be formed in one or more layers, which may be referred to as a logic layer or device layer. The dies 110 may be rectangular or square shaped. The dies 110 may be separated from each other by small spaces (e.g., less than 500 microns, or less than 200 microns) forming a grid, visible in FIG. 1A. These spaces are referred to as scribe lines, and typically do not include active circuitry.

The enlarged die 110 of FIG. 1A further illustrates signal vias 112, only one of which is labeled in FIG. 1A with a reference numeral, but a plurality of which are shown in FIG. 1A to be arranged in a grid-like manner. The signal vias 112 may extend in or through the die 110 in order to communicate signals to, from, or between various IC components (e.g., transistors, resistors, capacitors, interconnects, etc.) of the die 110. For example, the signal vias 112 may communicate signals to/from/between transistors implementing compute logic if the die 110 is a compute die. At least a portion of the signal vias 112 may also connect to interconnect structures outside the compute die 110, e.g., as discussed in relation to FIG. 2.

Figure 1B:
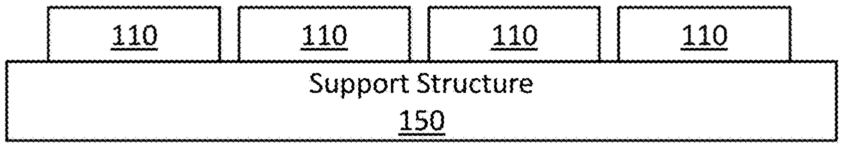

FIG. 1B illustrates an example cross-section of a wafer 100, taken through the plane AA' illustrated in FIG. 1A. In this example, the wafer 100 includes a support structure 150 over which multiple dies 110 are formed. While four dies 110 are illustrated in FIG. 1B, it should be understood that more dies, or fewer dies, maybe included in the cross-section. In this example, the dies 110 are arranged over the support structure 150. For example, the dies 110 may be fabricated, tested, and mounted onto the support structure 150. Alternatively, the dies 110 may be built up over the support structure 150. In other embodiments, the dies 110 may be formed fully or partially in the support structure 150, rather than resting on top of the support structure 150.

The support structure 150 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. Although a few examples of materials from which the substrate may be formed are described here, any material that may serve as a foundation upon which a full wafer device as described herein may be built falls within the spirit and scope of the present disclosure.

Figure 2:
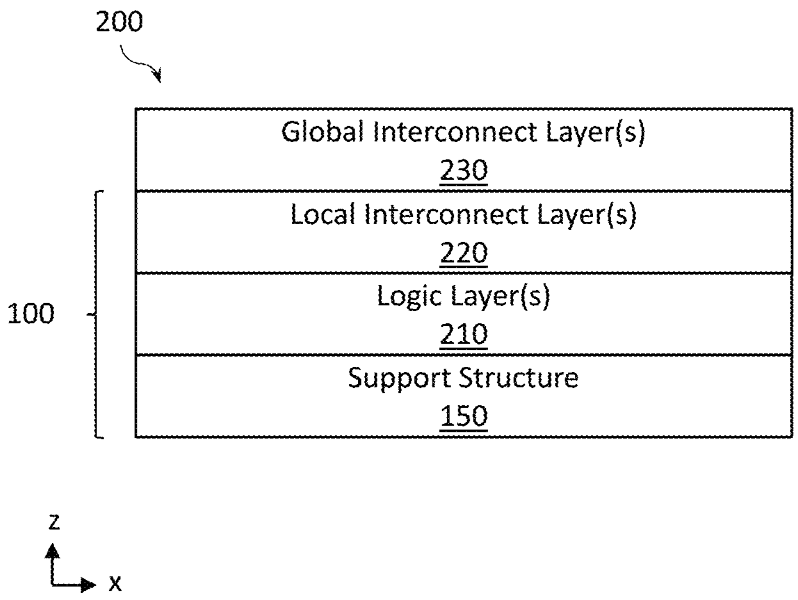
FIG. 2 provides a schematic illustration of a full-wafer device, according to some embodiments of the present disclosure.

FIG. 2 provides a schematic illustration of a full wafer device 200, according to some embodiments of the present disclosure. The full wafer device 200 includes the support structure 150 described in relation to FIG. 1. The full wafer device 200 further includes one or more logic layers 210 and one or more local interconnect layers 220. The support structure 150 has a front side and a back side, where the back side forms the back of the full wafer device 200. The logic layer 210 is formed over the front side of the support structure 150. The logic layers 210 may be computing logic layers that may include logic transistors and/or other logic devices. As described with respect to FIGS. 1A and 1B, the local interconnect layers 220 and logic layers 210 may be arranged in a plurality of dies (e.g., the dies 110). The local interconnect layers 220 connect to circuitry within a given die, i.e., each die 110 has a local interconnect structure in the local interconnect layers 220 coupled to logic in the logic layers 210. The local interconnect structures are not coupled between two or more dies. The logic layers 210 and local interconnect layers 220 may form a logic IC. In some embodiments, additional types of structures, such as memory devices, optical devices, passive circuitry, etc., may be included in the logic layers 210, local interconnect layers 220, and/or additional layers not depicted in FIG. 2. While the local interconnect layers 220 are depicted as being formed over the logic layers 210, in some embodiments, one or more local interconnect layers 220 may be formed below a logic layer 210 (e.g., between a logic layer 210 and the support structure 150). In some embodiments, one or more interconnect layers 220 may be interspersed between two logic layers 210. The support structure 150, logic layers 210, and local interconnect layers 220 form the wafer 100 shown in FIG. 1.

The full wafer device 200 further includes one or more global interconnect layers 230. The global interconnect layers 230 include interconnect structures that couple two or more dies together. In this example, the global interconnect layers 230 are formed over the local interconnect layers 220. Electrical signals, such as power and/or input/output (I/O) signals, may be routed to and/or from the logic layer 210 through the local interconnect layers 220 and the global interconnect layers 230. For example, electrically conductive features of the logic layer 210 (e.g., gates and source/drain (S/D) contacts of transistors in the logic layer 210) may be electrically coupled with the interconnect structures in the local interconnect layers 220. Interconnect structures in the local interconnect layers 220 may be electrically coupled with the interconnect structures in the global interconnect layers 230 to enable die-to-die communication in the full wafer device 200. The local interconnect layers 220 and global interconnect layers 230 may generally be referred to as back end layers, i.e., back end of line (BEOL) layers formed after the front end of line (FEOL) layers, which include the logic layer 210.

Figure 3A:
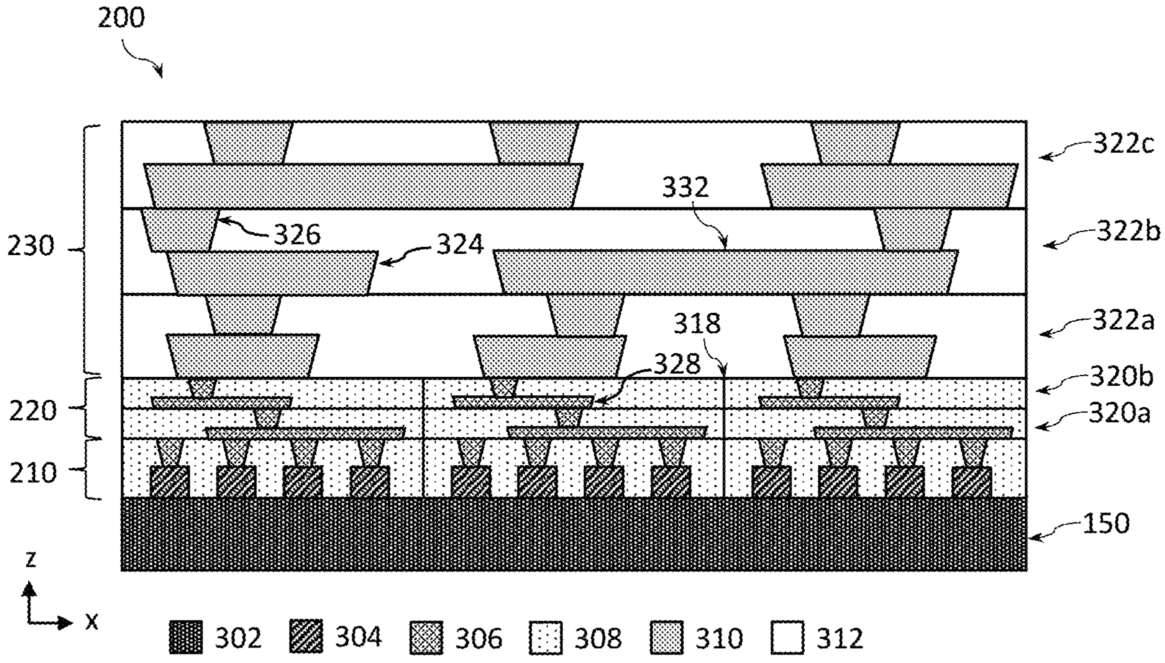
FIGS. 3A and 3B provide two cross-sections of a full wafer device including passive electronic components, according to some embodiments of the present disclosure.
Figure 3B:
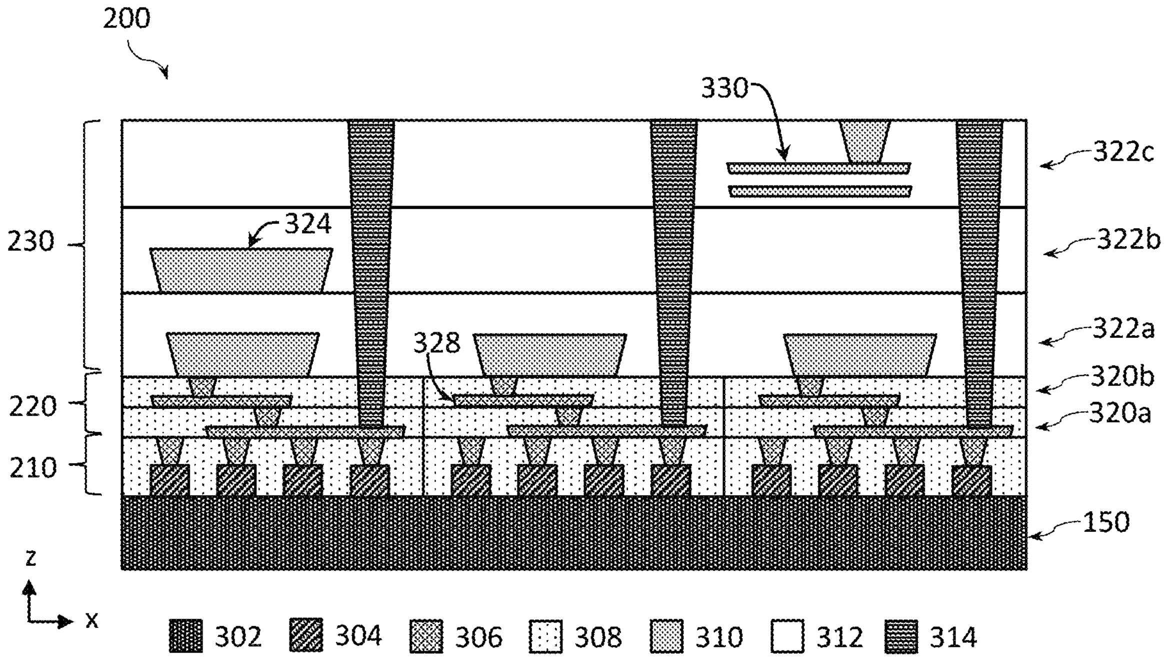

Interconnect structures in the local interconnect layers 220 and global interconnect layers 230 may be arranged in various layers to route electrical signals according to a wide variety of designs. In some embodiments, the interconnect structures may include trench structures (sometimes referred to as "lines") and via structures (sometimes referred to as "holes") filled with an electrically conductive material such as a metal. Trench structures may be arranged to route electrical signals in a direction of a plane that is substantially parallel with a surface of the support structure 150, while via structures may be arranged to route electrical signals in a direction of a plane that is substantially perpendicular to the surface of the support structure 150. Example trench and via structures are illustrated in FIGS. 3A and 3B.

In some embodiments, the global interconnect layers 230 may be fabricated in a separate process from the logic layers 210 and/or local interconnect layers 220. For example, in a first fabrication process, die-level structures including the logic layers 210 and local interconnect layers 220 are formed over the support structure 150 to produce a wafer with multiple dies, as illustrated in FIG. 1. In a second fabrication process, wafer-level structures, including the global interconnect layers 230, are formed over the wafer to produce the full wafer device 200.

In some embodiments, the die-level structures are first formed over a first support structure, and the dies are then singulated to provide discrete "chips" containing the die-level structures. The singulated dies may be tested, and accepted dies are assembled over the support structure 150 to produce the wafer 100. Then, the wafer-level structures, including the global interconnect layers 230, are formed over the reassembled dies to produce the full wafer device 200.

The full wafer device 200 may include passive devices, including resistors, inductors, and/or capacitors. For example, passive devices may be included in the full wafer device 200 to reduce EMI and/or suppress ESD in the device. Passive devices may be formed in any of the metal layers, e.g., in one or more of the global interconnect layers 230 and/or one or more of the local interconnect layers 220. The passive devices may be formed using an additive process, e.g., by removing portions of dielectric material to form regions where the passive devices are to be formed, and depositing a metal or other conductive material into these regions. This additive process may result in a seam within the passive device that can be observed in a cross-section of the full wafer device 200, e.g., in a cross-section taken in a plane parallel to the z-direction and perpendicular to the support structure 150. Example seams are shown in FIGS. 5-9 and described further below.

Example Cross-Sections of Wafer Device with Passive Devices

FIGS. 3A and 3B provide two cross-sections of a full wafer device including passive electronic components, according to some embodiments of the present disclosure. FIG. 3A shows a first cross-section in an x-z plane in the orientation of FIGS. 2 and 3A. FIG. 3B shows a second cross-section in a different x-z plane, i.e., a plane at a different position along a y-axis (into or out of the page). FIGS. 3A and 3B illustrate cross sections of the support structure 150, the logic layer 210, the local interconnect layer(s) 220, and the global interconnect layer(s) 230.

A number of elements referred to in the description of FIGS. 3A and 3B with reference numerals are illustrated in these figures with different patterns, with a legend showing the correspondence between the reference numerals and patterns being provided at the bottom of the drawing pages. For example, the legend in FIG. 3A illustrates that FIG. 3A uses different patterns to show a substrate 302, a transistor 304, a first conductive material 306, a first dielectric material 308, a second conductive material 310, a second dielectric material 312. The substrate 302 may include any of the materials described above with respect to the support structure 150.

As shown in FIGS. 3A and 3B, the wafer device 200 may include one or more, typically a plurality, of interconnect structures formed from the first conductive material 306 in the local interconnect layer 220. The wafer device 200 further includes one or more, typically a plurality, of interconnect structures formed from the second conductive material 310 in the global interconnect layers 230. The interconnect structures in the local interconnect layer 220 connect devices (e.g., transistors 304) within a given die. Scribe lines, e.g., scribe line 318, are illustrated between adjacent dies, which are examples of the dies 110. The interconnect structures in the global interconnect layer 230 may span multiple dies. For example, the interconnect structure 332 in the layer 322*b* spans two dies separated by the scribe line 318. The interconnect structure 332 can transmit signals between logic devices of two different dies of the wafer device 200, via interconnect structures in the layer 322*a* of the global interconnect layer 230 and the respective local interconnect layers 220 of the two dies separated by the scribe line 318.

Figure 4A:
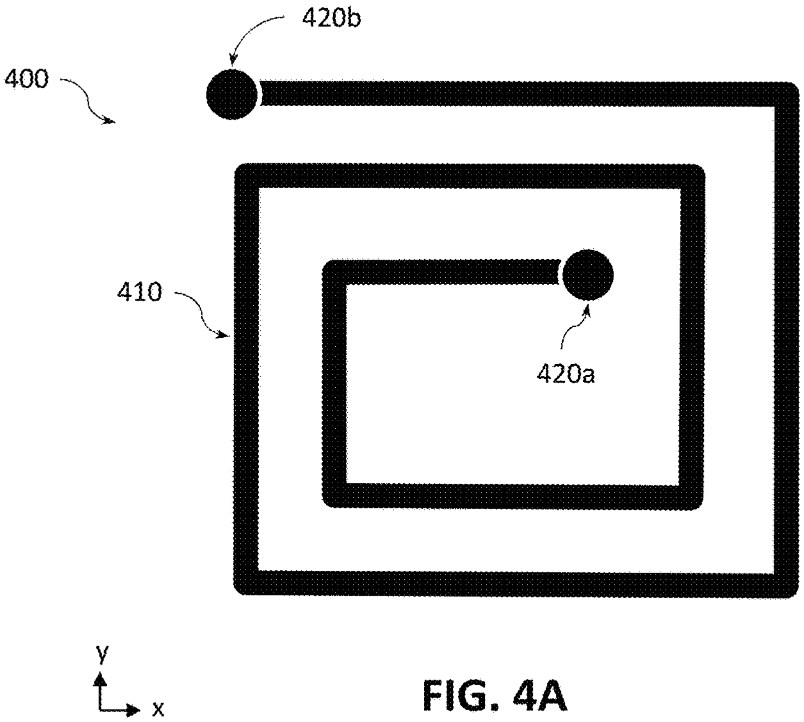
FIGS. 4A and 4B illustrate top-down views of two example passive electronic components, according to some embodiments of the present disclosure.
Figure 4B:
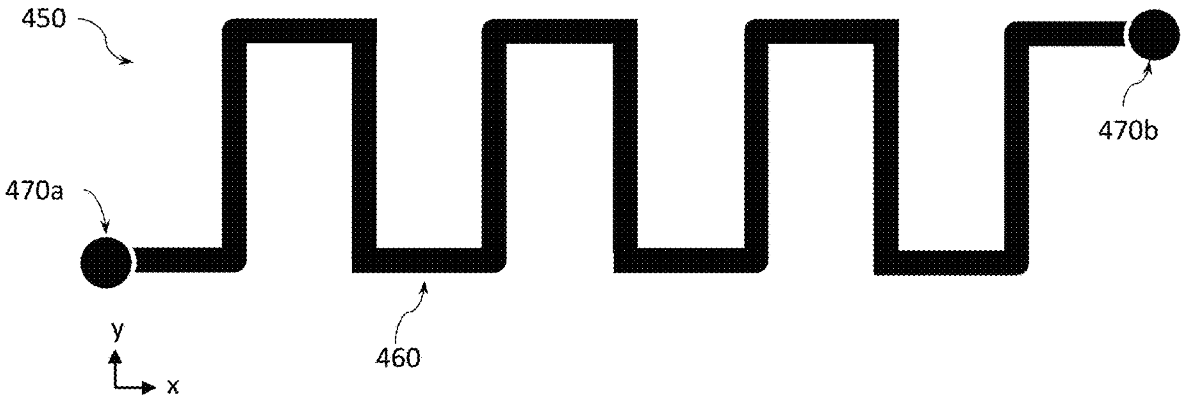

In addition, certain portions of the first conductive material 306 and/or second conductive material 310 may form one or more passive devices. In the illustrated embodiment, the conductive material 310 forms a first passive device 324 in a global interconnect layer 230, and the conductive material 306 forms a second passive device 328 in a local interconnect layer 220. In this example, the global interconnect layers 230 include three distinct layers (e.g., metal layers), labeled layers 322*a*, 322*b*, and 322*c*. The first passive device 324 is within the second metal layer 322*b* of the global interconnect layers 230. Furthermore, in this example, the local interconnect layers 220 include two distinct layers (e.g., metal layers), labeled layers 320*a* and 320*b*. The second passive device 328 is within the second metal layer 320*b* of the local interconnect layers 220. In other embodiments, passive devices may be formed in different or additional layers, e.g., different ones of the metal layers 320 and/or 322. For example, a passive device may span multiple metal layers, e.g., an inductor may include coils formed in the metal layers 322*b* and 322*c*. In some embodiments, a passive device may include multiple layered structures within a single metal layer 320 or 322. For example, as shown in FIG. 3B, the conductive material 310 is formed into two parallel plates, stacked over each other in the z-direction, in the metal layer 322*c*, to form a capacitor 330. Top views of an example inductor and an example resistor are illustrated in FIGS. 4A and 4B.

More generally, in the wafer device 200, the interconnects and passive devices may be arranged in one or more, typically a plurality, of layers of a metallization stack, where each layer may include an insulating material 308 or 312 (e.g., a dielectric material formed in multiple layers, as known in the art). The interconnects may include one or more conductive traces and conductive vias, providing one or more conductive pathways through the insulating materials 308 and 312. The conductive materials 306 and 310 may include any appropriate conductive material, such as copper, silver, nickel, gold, aluminum, or other metals or alloys, for example. The conductive pathways formed by the conductive material 306 may be connected to one another in any suitable manner. Similarly, the conductive pathways formed by the conductive material 310 may be connected to one another in any suitable manner. Although FIGS. 3A and 3B illustrate a specific number and arrangement of conductive pathways formed by the conductive materials 306 and 310, these are simply illustrative, and any suitable number and arrangement may be used.

In some embodiments, at least one of the insulating material 308 and the insulating material 312 may include a dielectric material, such as silicon dioxide, silicon nitride, oxynitride, polyimide materials, glass reinforced epoxy matrix materials, or a low-k or ultra-low-k dielectric (e.g., carbon-doped dielectrics, fluorine-doped dielectrics, porous dielectrics, organic polymeric dielectrics, photo-imagable dielectrics, and/or benzocyclobutene-based polymers). In some embodiments, at least one of the insulating material 308 and the insulating material 312 may include a semiconductor material, such as silicon, germanium, or a III-V material (e.g., gallium nitride), and one or more additional materials. For example, at least one of the insulating material 308 and the insulating material 312 may include silicon oxide or silicon nitride.

In some embodiments, the insulating material 308 in the logic layer 210 and the local interconnect layers(s) 220 is a different material from the insulating material 312 in the global interconnect layer(s) 230. For example, the insulating materials 308 and 312 may have different k-values. In other embodiments, the insulating materials 308 and 312 may be a same material. In different embodiments, different layers may have different insulating materials, e.g., the logic layer 210 and the local interconnect layers(s) 220 may be formed using different insulating materials rather than the same insulating material 308, or different layers (e.g., layer 322*a* and layer 322*b*) of the global interconnect layers 230 may include different insulating materials. Likewise, as shown in FIG. 3A, the first conductive material 306 in the logic layer 210 and the local interconnect layers(s) 220 is a different material from the second conductive material 310 in the global interconnect layer(s) 230. In other embodiments, the conductive materials 306 and 310 may be a same material. In different embodiments, different layers may have different conductive materials, e.g., the logic layer 210 and the local interconnect layers(s) 220 may be formed using different conductive materials rather than the same conductive material 306, or different layers (e.g., layer 322*a* and layer 322*b*) of the global interconnect layers 230 may include different conductive materials.

In some embodiments, conductive materials 306 and/or 310 may form conductive pathways to route power, ground, and/or signals to/from various components of the logic layer 210 and/or to the passive devices formed in the local and/or global interconnect layers 220 and 230. For example, the wafer device 200 may include conductive vias extending through one or more back end layers (e.g., through the global interconnect layers 230 and the local interconnect layers 220) to the logic layer 210. FIG. 3B illustrates vias 314, which extend through the global interconnect layers 230 and a portion of the local interconnect layers 220. Each via 314 is coupled to an interconnect structure in a local interconnect layer 320*a*, which couples signal or power from the via 314 to the logic layer 210. A via 314 may be a signal via for transmitting signals to or from the logic layer 210, or a via 314 may be a power via for delivering power to the wafer device 200. The vias 314 may be isolated from the surrounding silicon or other semiconductor material by a barrier oxide.

The conductive pathways formed by vias 314 may route power, ground, and/or signals between the wafer device 200 (in this example, a top of the wafer device 200) to a power and/or signal delivery device located “on top” of the wafer device 200. In some embodiments, the wafer device 200 may be the source and/or destination of signals communicated between the wafer device 200 and one or more devices coupled to the wafer device 200.

The logic layer 210 includes logic devices 304, e.g., transistors, coupled to the local interconnect layer 220, e.g., through vias formed from the first conductive material 306 or another conductive material. The logic layer 210 may include semiconductor material systems including, for example, N-type or P-type materials systems, as active materials (e.g., as channel materials of transistors). In some embodiments, logic devices 304 may include substantially monocrystalline semiconductors, such as silicon or germanium.

In some embodiments, the logic devices 304 may include compound semiconductors, e.g., compound semiconductors with a first sub-lattice of at least one element from group III of the periodic table (e.g., Al, Ga, In), and a second sub-lattice of at least one element of group V of the periodic table (e.g., P, As, Sb). In some embodiments, the logic devices 304 may include a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth.

In some embodiments, the logic devices 304 may be/include an intrinsic IV or III-V semiconductor material or alloy, not intentionally doped with any electrically active impurity. In alternate embodiments, nominal impurity dopant levels may be present within the logic devices 304, for example to set a threshold voltage Vt, or to provide halo pocket implants, etc. In such impurity-doped embodiments however, impurity dopant level within the active materials may be relatively low, for example below about $10^{15}$ $cm^{-3}$, and advantageously below $10^{13}$ $cm^{-3}$.

For exemplary P-type transistor embodiments, logic devices 304 may advantageously be formed using group IV materials having a high hole mobility, such as, but not limited to, Ge or a Ge-rich SiGe alloy. For some exemplary embodiments, such active materials may have a Ge content between 0.6 and 0.9, and advantageously is at least 0.7.

For exemplary N-type transistor embodiments, the logic devices 304 may advantageously be formed using a III-V material having a high electron mobility, such as, but not limited to InGaAs, InP, InSb, and InAs. For some such embodiments, the active material may be a ternary III-V alloy, such as InGaAs or GaAsSb. For some $In_xGa_{1-x}As$ fin embodiments, In content in the such active material may be between 0.6 and 0.9, and advantageously at least 0.7 (e.g., $In_{0.7}Ga_{0.3}As$).

In some embodiments, the logic devices 304 may be formed from thin-film materials, in which embodiments the logic devices 304 could be thin-film transistors (TFTs). A TFT is a special kind of a field-effect transistor (FET), made by depositing a thin film of an active semiconductor material, as well as a dielectric layer and metallic contacts, over a support structure that may be a non-conducting (and non-semiconducting) support structure. During operation of a TFT, at least a portion of the active semiconductor material forms a channel of the TFT, and, therefore, the thin film of such active semiconductor material is referred to herein as a "TFT channel material." This is different from conventional, non-TFT, transistors where the active semiconductor channel material is typically a part of a semiconductor substrate, e.g., a part of a silicon wafer. In various such embodiments, active materials of the devices 304 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide.

In general, active materials of the logic devices 304 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc.

Example Passive Devices

FIGS. 4A and 4B illustrate top-down views of two example passive electronic components, according to some embodiments of the present disclosure. FIG. 4A provides a top view of an inductor 400. The inductor 400 is formed in the x-y plane, e.g., the inductor 400 lays over the substrate 150 and extends across a plane that is parallel to the substrate 150. The inductor 400 includes a conductive structure 410, which is formed from conductive lines arranged in a coil. The conductive lines may be made of a conductive material, e.g., the conductive material 306 or 310, and is surrounded by an insulator, e.g., the insulating material 308 or 312. In this example, the coil includes two full loops, but in other embodiments, more or fewer loops may be formed. The inductor 400 of FIG. 4A is disposed in a single interconnect layer of a metallization stack (e.g., the metal layer 322*b* of the global interconnect layers 320, if the inductor 400 is the passive device 324). In other embodiments, an inductor spans multiple interconnect layers of a metallization stack. The inductor 400 may be include two vias 420*a* and 420*b* at either end of the conductive structure 410. The vias 430*a* and 430*b* connect to other integrated circuit elements and enable current to flow through the conductive structure 410. For example, the via 420*b* may correspond to the via 326 illustrated in FIG. 3A.

FIG. 4B provides a top view of a resistor 450. The resistor 450 is formed in the x-y plane, e.g., the resistor 450 lays over the substrate 150 and extends across a plane that is parallel to the substrate 150. The resistor 450 includes a conductive structure 460, which is formed from conductive lines, e.g., a series of connected trenches. The conductive lines may be made of a conductive material, e.g., the conductive material 306 or 310, and is surrounded by an insulator, e.g., the insulating material 308 or 312. The resistor 450 of FIG. 4B is disposed in a single interconnect layer of a metallization stack (e.g., the metal layer 322*b* of the global interconnect layers 230, if the resistor 450 is the passive device 324). In other embodiments, a resistor spans multiple interconnect layers of a metallization stack, e.g., the resistor may be formed using trenches in multiple layers coupled by vias. The resistor 450 may be include two vias 470*a* and 470*b* at either end of the conductive structure 460. The vias 470*a* and 470*b* connect to other integrated circuit elements and enable current to flow through the conductive structure 460. For example, the via 470*b* may correspond to the via 326 illustrated in FIG. 3A.

Example Seams in Passive Devices

The passive devices described above (e.g., a passive device 324 formed in a global interconnect layer 230, or a passive device 328 formed in a local interconnect layer 220) may be formed using an additive process. The additive process for forming the passive devices may result in a seam that can be observed in a cross-section of the passive device, e.g., a cross-section in the x-z direction in the coordinate system used herein.

Figure 5:
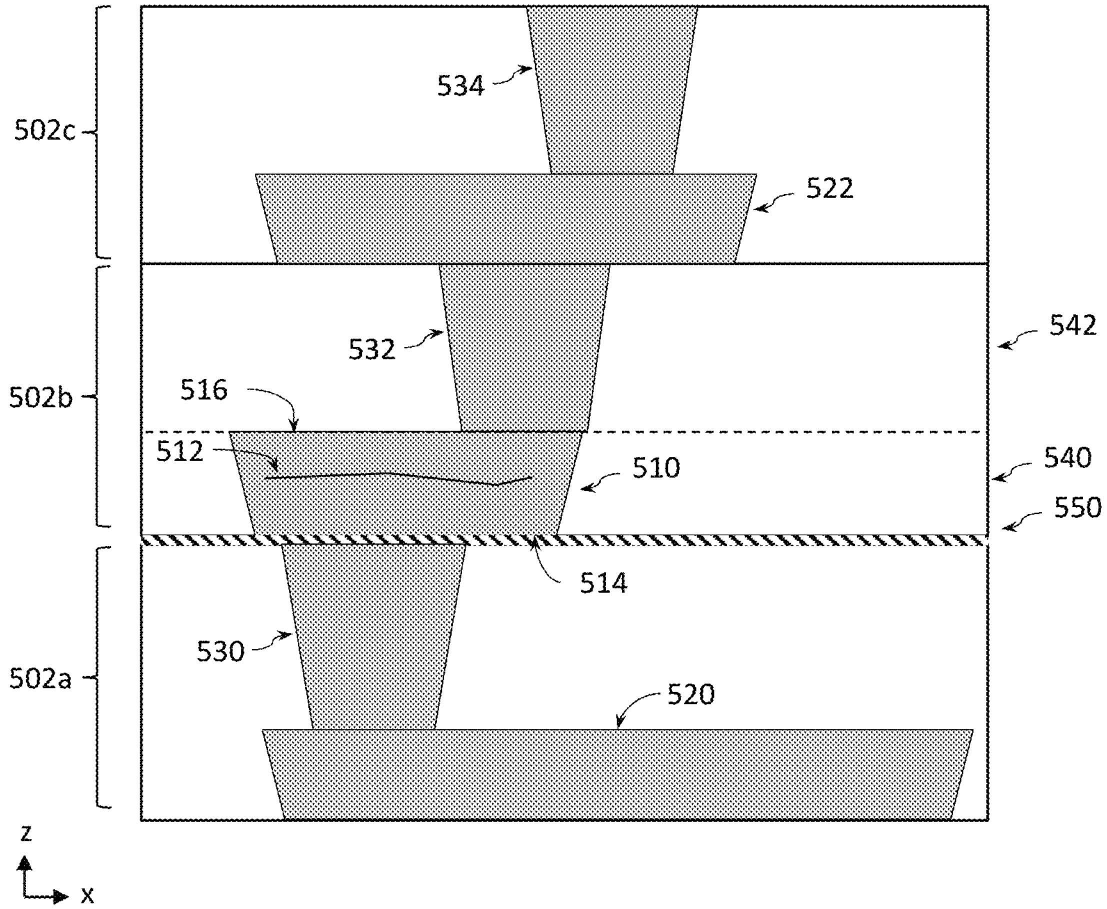
FIG. 5 is a cross-section view of an example passive electronic component with a seam, according to some embodiments of the present disclosure.

FIG. 5 is a cross-section view of an example passive electronic component with a seam, according to some embodiments of the present disclosure. FIG. 5 illustrates three example metallization layers 502*a*, 502*b*, and 502*c*, which may correspond to the layers 320 of the local interconnect layers 220 or the layers 322 of the global interconnect layers 230. In this example, a passive device 510 is formed in the second layer 502*b*. The passive device 510 is coupled to a via 530 in the first layer 502*a*, and a via 532 in the second layer 502*b*. The via 530 is further coupled to an interconnect structure 520 or another passive device 520 in the first layer 520*a*. The via 532 is coupled to the third layer 502*c*, specifically, an interconnect structure 522 or another passive device 522, which is in turn coupled to a via 534. The arrangement in FIG. 5 is merely exemplary. For example, the passive device 510 may be coupled to two different interconnect structures in the first layer 502*a*, and not coupled to structures in the third layer 502*c*.

As illustrated in FIG. 5, the passive device 510 has a seam 512 extending through the cross-section of the passive device 510. The seam 512 extends in a direction substantially parallel to the support structure 150. The seam 512 may also extend at least in part in the y-direction, i.e., into and/or out of the page. Said another way, the seam 512 may be visible in another x-z cross-section of the passive device 510 taken at a different position in the y-direction. The seam 512 may be observed in the cross-section, e.g., in a SEM image or TEM image of the cross-section.

The seam 512 may be an artifact of an additive process used to form the passive device 510. For example, to fabricate the passive device 510, a first layer 540 of an insulating material (e.g., the insulating material 308 or 312) is deposited over the layer 502*a*. In some embodiments, an etch stop material 550 is deposited prior to depositing the first layer 540 of insulating material. The first layer 540 of the insulating material 308 or 312 is patterned, e.g., using a lithographic process. A second layer 542 of the insulating material 308 or 312 (or a different insulating material) is then deposited. In some embodiments, an etch stop material (not show in FIG. 5) is deposited prior to depositing the second layer 542 of the insulating material. The dashed line in FIG. 5 indicates a boundary between the first layer 540 and the second layer 542. The second layer 542 of the insulating material 308 or 312 is patterned, e.g., using a lithographic process. A portion of the second layer 542 of the insulating material 308 or 312, and a portion of the first layer 540 of the insulating material 308 or 312, are etched based on the patterning. In particular, a portion of the second layer 542 corresponding to the via 532 is etched, and a portion of the first layer 540 corresponding to the passive device 510 is etched. Thus, a cavity corresponding to the via 532 and a cavity corresponding to the passive device 510 are formed. A material for forming the passive device 510 and the via 532 (e.g., the conductive material 306 or 310) is deposited into the etched areas using a conformal deposition process, such as atomic layer deposition (ALD).

In the conformal deposition process, the conductive material for forming the passive device 510 enters the first layer 540 through the hole formed for the via 532. The seam 512 is a discontinuity in the conductive material that forms the passive device. During the conformal deposition process, a portion of the conductive material builds up over a lower surface of the cavity for forming the passive device 510, and a portion of the conductive material builds up below an upper surface of the cavity for forming the passive device 510. These two sides meet near a center of the height of the passive device 510, forming the seam 512.

Each of the structures illustrated in FIG. 5 has an upside-down trapezoidal shape which may result by building the layers up from the support structure 150. For example, a cross-section of the passive device 512 has a back side 514, or base, parallel to the support structure 150 and a front side 516, or top, parallel to the support structure 150. The front side 516 is farther from the support structure 150 than the back side 514. A length of the back side 514 in the x-direction is shorter than a length of the front side 516 in the x-direction. Similarly, a length of a back side of the vias is shorter than a length of a front side of the same via. Similarly, a length of a back side of each trench structure (e.g., the structures 520 and 522) is shorter than a length of the front side of the same structure.

Figure 6:
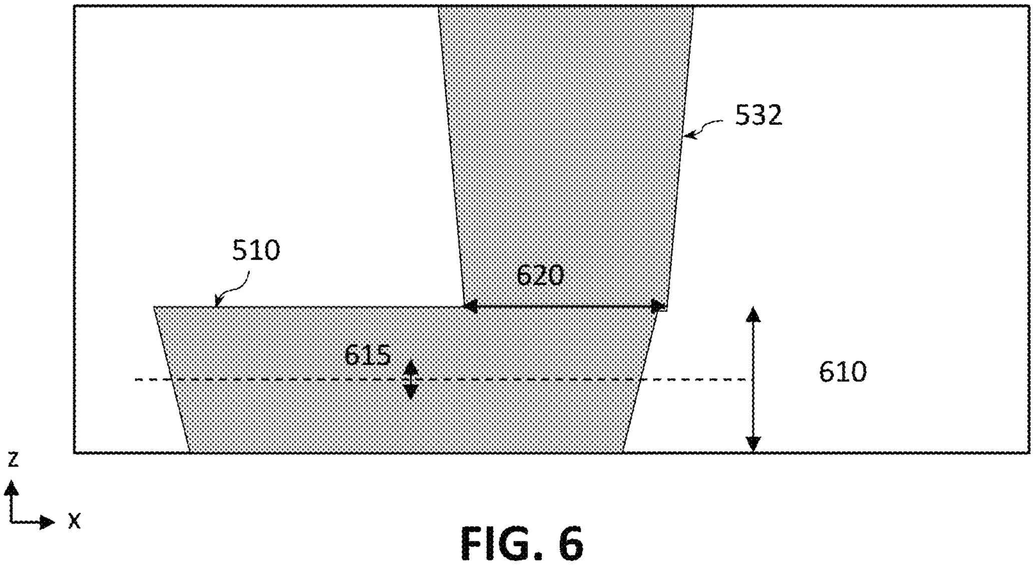
FIG. 6 is a cross-section view illustrating heights of the passive device and the seam, according to some embodiments of the present disclosure.

FIG. 6 is a cross-section illustrating heights of the passive device and the seam, according to some embodiments of the present disclosure. The passive device 510 has a height 610 in the z-direction extending from a base of the passive device 510 (e.g., the back side 514 shown in FIG. 5) to a top of the passive device 510 (e.g., the front side 516 shown in FIG. 5). The height 610 may be, for example, between 10 nanometers and 200 nanometers. As noted above, in some embodiments, the passive device 510 may comprise multiple layers (e.g., two parallel plates, or an inductor that extends across multiple metal layers or multiple sub-layers of a metal layer), and the total device height may be greater than the height 610, e.g., each layer of the passive device 510 may be between 10 and 200 nanometers. In such examples, the structure 510 illustrated in FIGS. 5 and 6 may represent one portion of the passive device, e.g., a portion of an inductor coil, a portion of a resistor, or a capacitor plate.

The seam 512 may be formed within a range 615 around a midpoint of the height 610 of the passive device 510. For example, the range 615 of possible locations for the seam 512 may be between 40% and 60% of the height 610. For example, if the height 610 of the passive device 510 is 100 nanometers, the seam 512 may be located between 40 nanometers and 60 nanometers from a base of the passive device 510 parallel to the support structure 150.

FIG. 6 also illustrates a width 620 of the via 532, in particular, of the base of the via 532. In order to fill the passive device 510 with the conductive material during the conformal deposition process, the width 620 of the via 532 is greater than the height 610 of the passive device 510. This is because the conductive material builds up along the sides of the via 532 while the conductive material fills the cavity for forming the passive device 510, so the via 532 has an opening while the passive device 510 is being deposited. After the passive device 510 is fully deposited, the conformal deposition may proceed to fully fill the cavity for forming the via 532.

In different embodiments, the seam 512 can form in various ways and may have different appearances in the cross-section. For example, the seam 512 may be an air gap between a lower portion of the passive device 510 (e.g., a portion closer to a support structure 150) and an upper portion of the passive device 510 (e.g., a portion farther from the support structure 150). As another example, the seam 512 is a discontinuity in the material structure (e.g., crystal structure or grain structure) between the lower portion and upper portion of the passive device 510. As yet another example, the seam 512 is formed by a chemical difference between the lower portion and the upper portion of the passive device 510. Alternatively, a material along the seam 512 may have a different chemical composition than other portions of the passive device 510 (e.g., a different percentage of oxygen, nitrogen, or another element from surrounding regions of the passive device 510).

Figure 7:
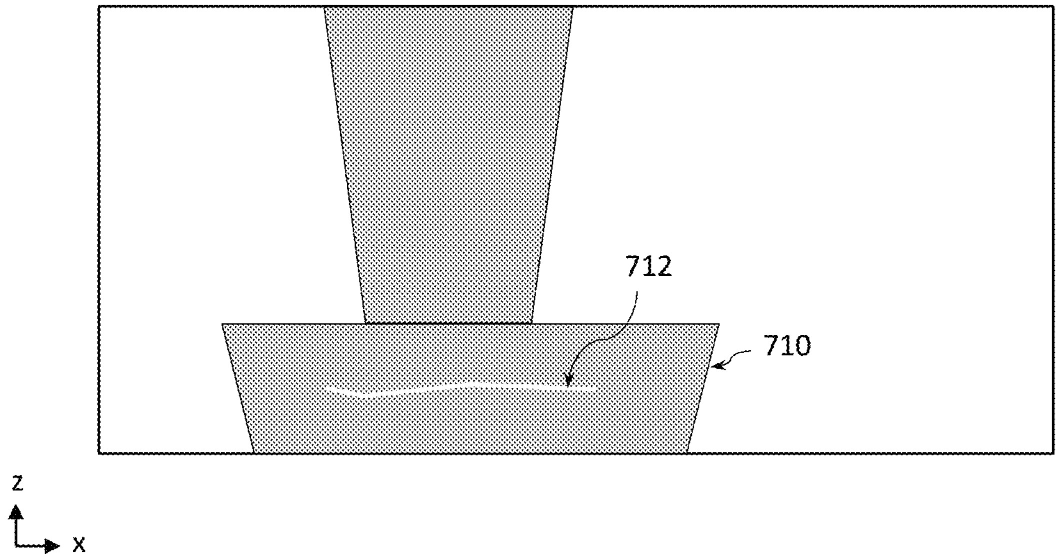
FIG. 7 is a cross-section view of an example passive device with an air gap seam, according to some embodiments of the present disclosure.

FIG. 7 is a cross-section view of an example passive electronic component with an air gap seam, according to some embodiments of the present disclosure. In this example, the passive device 710 is formed from a conductive material (e.g., conductive material 306 or 310), and an air gap 712 is not filled by the conductive material.

Figure 8:
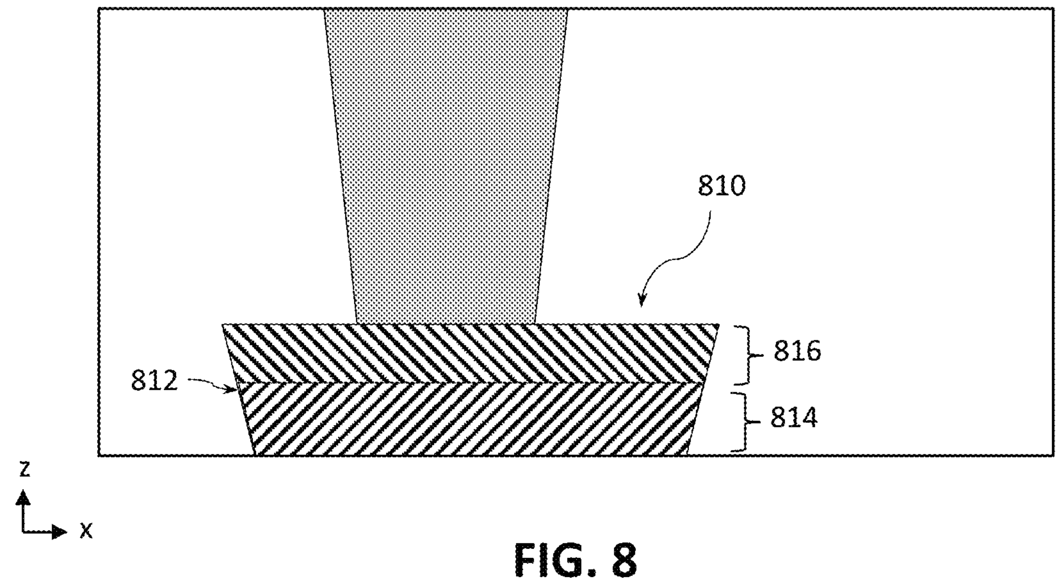
FIG. 8 is a cross-section view of an example passive device with a seam formed by differing material structures, according to some embodiments of the present disclosure.

FIG. 8 is a cross-section view of an example passive electronic component with a seam formed by differing material structures, according to some embodiments of the present disclosure. In this example, the passive device 810 has a lower portion 814 below a seam 812 and an upper portion 816 above the seam 812. The lower portion 814 and the upper portion 816 form with different material structures, e.g., different grain structures or different crystal structures. The seam 812 is a discontinuity of the material structures at the junction of the lower portion 814 and the upper portion 816.

Figure 9:
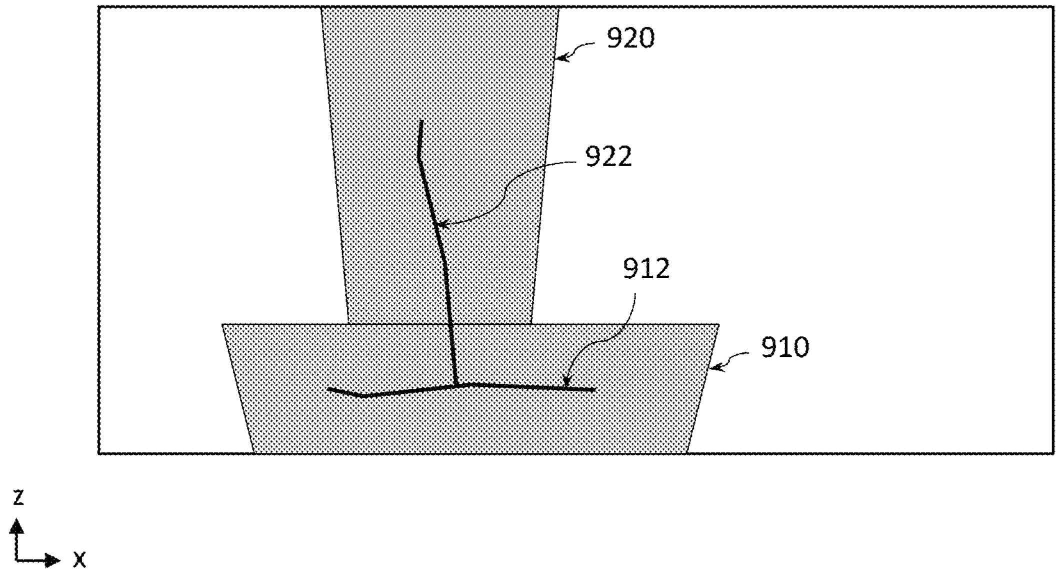
FIG. 9 is a cross-section view of an example passive device with a seam that extends into a via, according to some embodiments of the present disclosure.

In some embodiments, a seam may extend into a via formed over the passive device. FIG. 9 is a cross-section view of an example passive electronic component with a seam that extends into a via, according to some embodiments of the present disclosure. In this example, the passive device 910 includes a seam 912. A further seam 922 extends upwards from the seam 912 and into the via 920. The seams 922 and 912 roughly form an inverted T-shape. If, as another example, the via 920 were formed near a side of the passive device 910 rather than in near the center (as depicted), the seams may form an L shape (if the via is on the left in the orientation shown) or a reverse L shape (if the via is on the right in the orientation shown). The seam 922 may extend all the way up the via 920, or partially up the via 920, as depicted in FIG. 9. While the seams 912 and 922 are depicted as connecting in FIG. 9, in other embodiments, the seams 912 and 922 may not connect, e.g., a region without a seam may be present between the seams 912 and 922.

Example Devices

The passive devices disclosed herein may be included in any suitable electronic device. FIGS. 10-13 illustrate various examples of apparatuses that may include the passive devices disclosed herein.

Figure 10A:
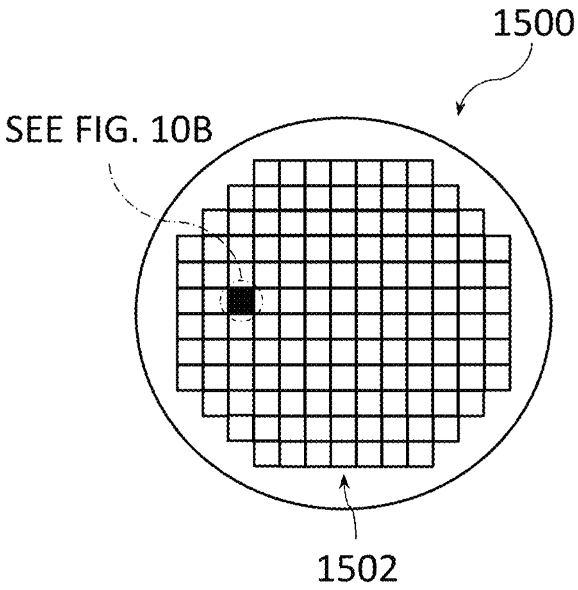
FIGS. 10A and 10B are top views of, respectively, a wafer and dies that may include one or more passive devices in accordance with any of the embodiments disclosed herein.
Figure 10B:
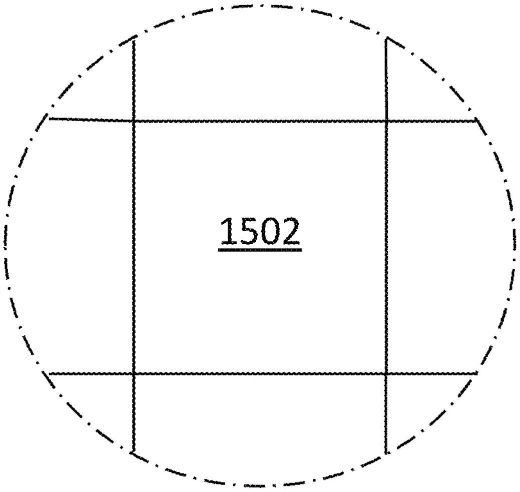

FIGS. 10A and 10B are top views of a wafer and dies that include one or more passive devices in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC structure (e.g., the IC structures as shown in any of FIGS. 1-9, or any further embodiments of the IC structures described herein). After the fabrication of the semiconductor product is complete or partially complete (e.g., after manufacture of one or more IC structures with one or more passive devices as described herein, or prior to reassembly of dies in a full wafer device), the wafer 1500 may undergo a singulation process in which each of the dies 1502 is separated from one another to provide discrete "chips" of the semiconductor product. In particular, devices that include one or more passive devices as disclosed herein may take the form of the wafer 1500 (e.g., not singulated) or the form of the die 1502 (e.g., singulated). The die 1502 may include one or more transistors (e.g., one or more of the transistors 1640 of FIG. 11, discussed below) and/or supporting circuitry to route electrical signals to the transistors, as well as any other IC components (e.g., one or more passive devices). In some embodiments, the wafer 1500 or the die 1502 may include a memory device (e.g., an SRAM device), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 13) or other logic that is configured to store information in the memory devices or execute instructions stored in the memory array.

Figure 11:
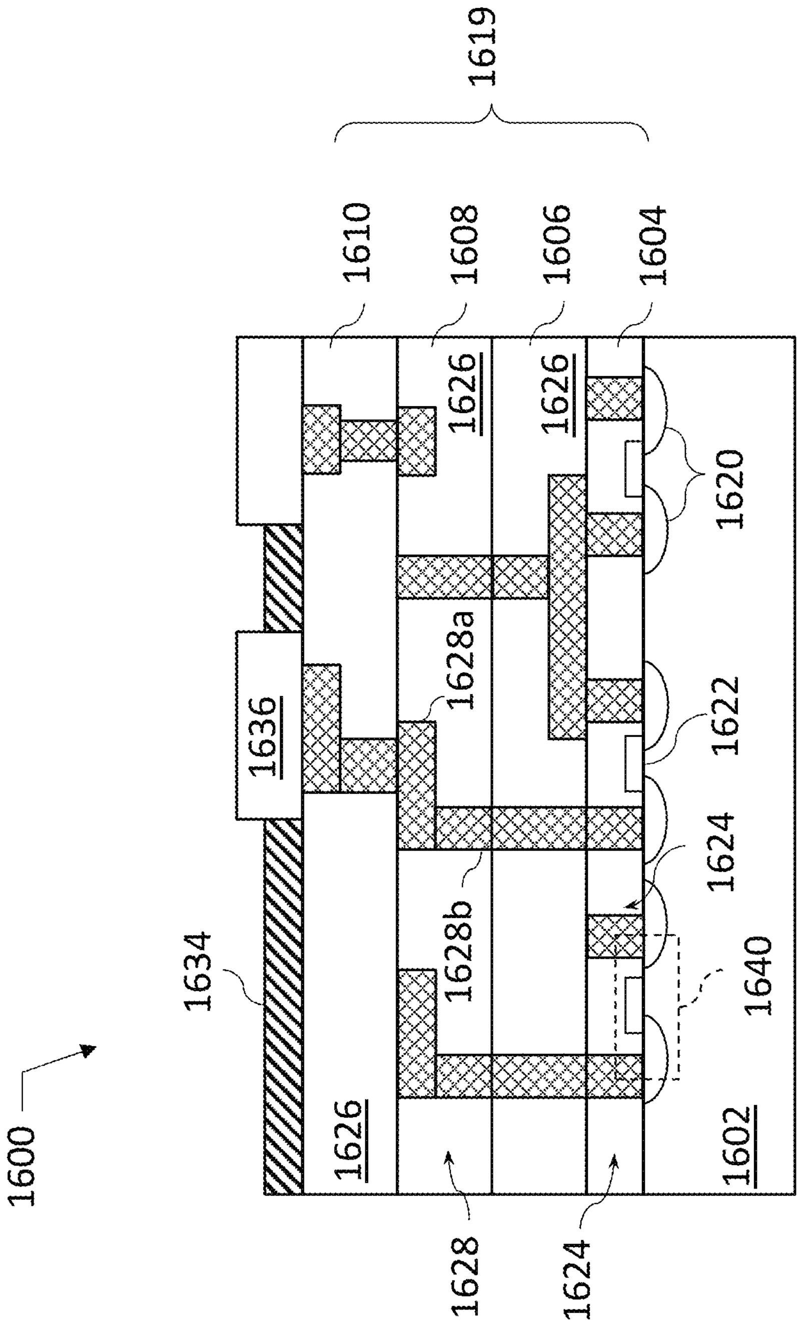
FIG. 11 is a cross-sectional side view of an IC package that may include one or more passive devices in accordance with any of the embodiments disclosed herein.

FIG. 11 is a cross-sectional side view of an IC device 1600 that may include one or more passive devices in accordance with any of the embodiments disclosed herein. The IC device 1600 may be formed on a substrate 1602 (e.g., the wafer 1500 of FIG. 10A) and may be included in a die (e.g., the die 1502 of FIG. 10B). The substrate 1602 may be any substrate as described herein. The substrate 1602 may be part of a singulated die (e.g., the dies 1502 of FIG. 10B) or a wafer (e.g., the wafer 1500 of FIG. 10A).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 11 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate electrode layer and a gate dielectric layer.

The gate electrode layer may be formed on the gate interconnect support layer and may consist of at least one P-type workfunction metal or N-type workfunction metal, depending on whether the transistor is to be a PMOS or an NMOS transistor, respectively. In some implementations, the gate electrode layer may consist of a stack of two or more metal layers, where one or more metal layers are workfunction metal layers and at least one metal layer is a fill metal layer. Further metal layers may be included for other purposes, such as a barrier layer or/and an adhesion layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, aluminum carbide, tungsten, tungsten carbide. An N-type metal layer will enable the formation of an NMOS gate electrode with a workfunction that is between about 3.9 eV and about 4.2 eV.

In some embodiments, when viewed as a cross section of the transistor 1640 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a FinFET transistor does not have a "flat" upper surface, but instead has a rounded peak).

Generally, the gate dielectric layer of a transistor 1640 may include one layer or a stack of layers, and the one or more layers may include silicon oxide, silicon dioxide, and/or a high-k dielectric material. The high-k dielectric material included in the gate dielectric layer of the transistor 1640 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The IC device 1600 may include one or more passive devices at any suitable location in the IC device 1600.

The S/D regions 1620 may be formed within the substrate 1602 adjacent to the gate 1622 of each transistor 1640, using any suitable processes known in the art. For example, the S/D regions 1620 may be formed using either an implantation/diffusion process or a deposition process. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion implantation process. In the latter process, an epitaxial deposition process may provide material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620. In some embodiments, an etch process may be performed before the epitaxial deposition to create recesses in the substrate 1602 in which the material for the S/D regions 1620 is deposited.

Electrical signals, such as power and/or input/output (I/O) signals, may be routed to and/or from the transistors 1640 of the device layer 1604 through one or more interconnect layers disposed on the device layer 1604 (illustrated in FIG. 11 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form an ILD stack 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 11). Although a particular number of interconnect layers 1606-1610 is depicted in FIG. 11, embodiments of the present disclosure include IC devices having more or fewer interconnect layers than depicted.

In some embodiments, the interconnect structures 1628 may include trench contact structures **1628*a* (sometimes referred to as "lines") and/or via structures 1628*b* (sometimes referred to as "holes") filled with an electrically conductive material such as a metal. The trench contact structures 1628*a* may be arranged to route electrical signals in a direction of a plane that is substantially parallel with a surface of the substrate 1602 upon which the device layer 1604 is formed. For example, the trench contact structures 1628*a* may route electrical signals in a direction in and out of the page from the perspective of FIG. 11. The via structures 1628*b* may be arranged to route electrical signals in a direction of a plane that is substantially perpendicular to the surface of the substrate 1602 upon which the device layer 1604 is formed. In some embodiments, the via structures 1628*b* may electrically couple trench contact structures 1628*a* of different interconnect layers 1606-1610** together.

The interconnect layers 1606-1610 may include a dielectric material 1626 disposed between the interconnect structures 1628, as shown in FIG. 11. The dielectric material 1626 may take the form of any of the embodiments of the dielectric material provided between the interconnects of the IC structures disclosed herein.

In some embodiments, the dielectric material 1626 disposed between the interconnect structures 1628 in different ones of the interconnect layers 1606-1610 may have different compositions. In other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include trench contact structures **1628*a* and/or via structures 1628*b*, as shown. The trench contact structures 1628*a* of the first interconnect layer 1606 may be coupled with contacts (e.g., the S/D contacts 1624) of the device layer 1604**.

A second interconnect layer 1608 (referred to as Metal 2 or "M2") may be formed directly on the first interconnect layer 1606. In some embodiments, the second interconnect layer 1608 may include via structures **1628*b* to couple the trench contact structures 1628*a* of the second interconnect layer 1608 with the trench contact structures 1628*a* of the first interconnect layer 1606. Although the trench contact structures 1628*a* and the via structures 1628*b* are structurally delineated with a line within each interconnect layer (e.g., within the second interconnect layer 1608) for the sake of clarity, the trench contact structures 1628***a* and the via structures 1628*b* may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606.

The IC device 1600 may include a solder resist material 1634 (e.g., polyimide or similar material) and one or more bond pads 1636 formed on the interconnect layers 1606-1610. The bond pads 1636 may be electrically coupled with the interconnect structures 1628 and configured to route the electrical signals of the transistor(s) 1640 to other external devices. For example, solder bonds may be formed on the one or more bond pads 1636 to mechanically and/or electrically couple a chip including the IC device 1600 with another component (e.g., a circuit board). The IC device 1600 may have other alternative configurations to route the electrical signals from the interconnect layers 1606-1610 than depicted in other embodiments. For example, the bond pads 1636 may be replaced by or may further include other analogous features (e.g., posts) that route the electrical signals to external components.

Figure 12:
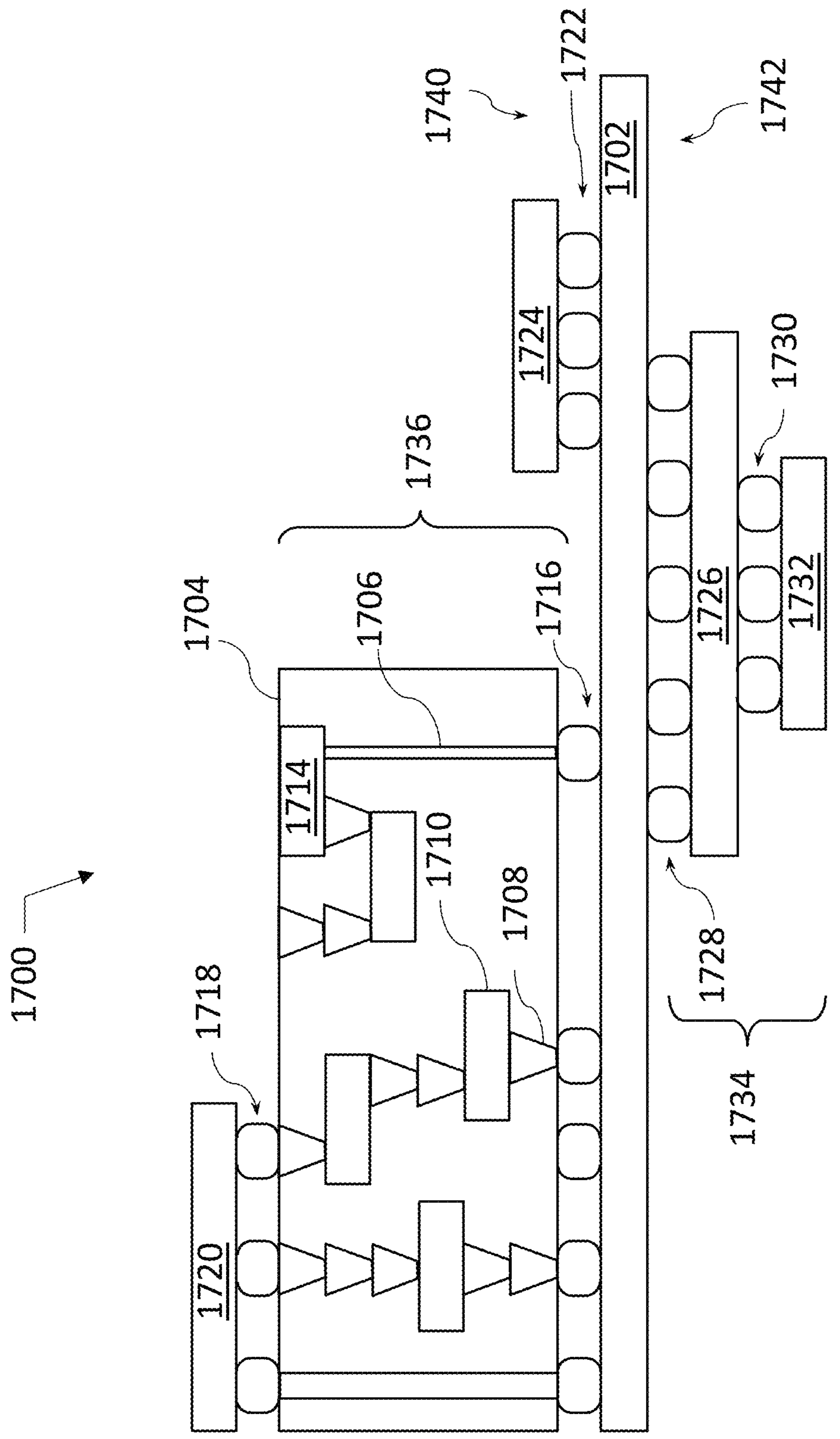
FIG. 12 is a cross-sectional side view of an IC device assembly that may include one or more passive devices in accordance with any of the embodiments disclosed herein.

FIG. 12 is a cross-sectional side view of an IC device assembly 1700 that may include components having or being associated with (e.g., being electrically connected by means of) one or more passive devices in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. In particular, any suitable ones of the components of the IC device assembly 1700 may include any of the passive devices disclosed herein.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 12 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702 and may include solder balls (as shown in FIG. 12), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 12, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 10B), an IC device (e.g., the IC device 1600 of FIG. 11), or any other suitable component. In some embodiments, the IC package 1720 may include passive devices, as described herein. Generally, the interposer 1704 may spread a connection to a wider pitch or reroute a connection to a different connection. For example, the interposer 1704 may couple the IC package 1720 (e.g., a die) to a ball grid array (BGA) of the coupling components 1716 for coupling to the circuit board 1702. In the embodiment illustrated in FIG. 12, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, a ceramic material, or a polymer material such as polyimide. In some implementations, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1704. The interposer 1704 may further include the passive devices as described herein. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 12 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

FIG. 13 is a block diagram of an example computing device 1800 that may include one or more components including one or more passive devices in accordance with any of the embodiments disclosed herein. For example, any suitable ones of the components of the computing device 1800 may include a die (e.g., the die 1502 of FIG. 10B) or a wafer device (e.g., the wafer 1500 of FIG. 10A) having passive devices as described herein. Any one or more of the components of the computing device 1800 may include, or be included in, an IC device 1600 (FIG. 11). Any one or more of the components of the computing device 1800 may include, or be included in, an IC device assembly 1700 (FIG. 12).

A number of components are illustrated in FIG. 13 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single system-on-a-chip (SoC) die.

Additionally, in various embodiments, the computing device 1800 may not include one or more of the components illustrated in FIG. 13, but the computing device 1800 may include interface circuitry for coupling to the one or more components. For example, the computing device 1800 may not include a display device 1806, but may include display device interface circuitry (e.g., a connector and driver circuitry) to which a display device 1806 may be coupled. In another set of examples, the computing device 1800 may not include an audio input device 1824 or an audio output device 1808 but may include audio input or output device interface circuitry (e.g., connectors and supporting circuitry) to which an audio input device 1824 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-M RAM).

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display, for example.

The computing device 1800 may include an audio output device 1808 (or corresponding interface circuitry, as discussed above). The audio output device 1808 may include any device that generates an audible indicator, such as speakers, headsets, or earbuds, for example.

The computing device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The computing device 1800 may include a GPS device 1818 (or corresponding interface circuitry, as discussed above). The GPS device 1818 may be in communication with a satellite-based system and may receive a location of the computing device 1800, as known in the art.

The computing device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1800 may be any other electronic device that processes data.

Select Examples

The following paragraphs provide various examples of the embodiments disclosed herein.

Example 1 provides a device including a support structure having a front side and a back side; computing logic over the front side of the support structure, the computing logic arranged as a plurality of dies; and a back end layer over the computing logic, the back end layer including a passive electronic structure having a seam, the seam extending through the passive electronic structure substantially parallel to the support structure.

Example 2 provides the device according to Example 1, further including a second back end layer over the back end layer, the second back end layer including an interconnect structure.

Example 3 provides the device according to Example 1 or 2, further including a power via extending through the back end layer to one of the plurality of dies.

Example 4 provides the device according to Example 3, further including a signal via extending through the back end layer to one of the plurality of dies.

Example 5 provides the device according to any of the previous examples, where the passive electronic structure is a resistor.

Example 6 provides the device according to any of Examples 1 through 4, where the passive electronic structure is an inductor.

Example 7 provides the device according to any of Examples 1 through 4, where the passive electronic structure is a capacitor.

Example 8 provides the device according to any of the previous examples, where the passive electronic structure includes a conductive material, and the seam is an air gap within the conductive material.

Example 9 provides the device according to any of Examples 1 through 7, where the passive electronic structure includes a first portion of conductive material between the seam and the support structure and a second portion of conductive material over the seam, the first portion of conductive material having a different material structure from the second portion of conductive material.

Example 10 provides the device according to any of Examples 1 through 7, where the passive electronic structure includes a conductive material, and the seam includes a different chemical structure from a region of the passive electronic structure above the seam.

Example 11 provides the device according to any of the previous examples, where the passive electronic structure has a base parallel to the support structure and a height in a direction perpendicular to the support structure, and the seam is located at a height above the base in a range between 40% and 60% of the height.

Example 12 provides the device according to any of the previous examples, further including a via coupled to the passive electronic structure and formed over the passive electronic structure.

Example 13 provides the device according to Example 12, where the passive electronic structure has a height in a direction perpendicular to the support structure, and the via has a width in a direction parallel to the support structure, the width of the via greater than the height of the passive electronic structure.

Example 14 provides the device according to any of the previous examples, where a cross-section of the passive electronic structure has a back side parallel to the support structure and a front side parallel to the support structure, the front side farther from the support structure than the back side, where a length of the back side is shorter than a length of the front side.

Example 15 provides a wafer including a logic layer including a plurality of dies, one of the plurality of dies including a plurality of transistors; and an interconnect layer over the logic layer, the interconnect layer including an interconnect structure electrically coupled to one of the plurality of transistors, the interconnect layer further including a passive electronic device having a seam, the seam extending through the passive electronic device substantially parallel to the logic layer.

Example 16 provides the wafer according to Example 15, where the passive electronic device is a resistor or an inductor.

Example 17 provides the wafer according to Example 15 or 16, where the passive electronic device includes a conductive material, and the seam is an air gap within the conductive material.

Example 18 provides the wafer according to Example 15 or 16, where the passive electronic device includes a first portion of conductive material between the seam and the logic layer and a second portion of conductive material over the seam, the first portion of conductive material having a different material structure from the second portion of conductive material.

Example 19 provides a method for fabricating a passive device including forming a first dielectric layer over a full wafer device; patterning the first dielectric layer; forming a second dielectric layer over the first dielectric layer; patterning the second dielectric layer; etching portions of the first dielectric layer to form a cavity for a passive device; and conformally depositing a conductive material in the cavity for the passive device, the deposited conductive material forming at least a portion of the passive device.

Example 20 provides method according to Example 19, where the passive device has a seam, the seam extending through the passive device substantially parallel to a support structure of the full wafer device.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. A device comprising:

a support structure having a front side and a back side;

computing logic over the front side of the support structure, the computing logic arranged as a plurality of dies; and a back end layer over the computing logic, the back end layer comprising a passive electronic structure, the passive electronic structure comprising a conductive material and a seam within the conductive material, the seam extending through the conductive material substantially parallel to the front side of the support structure.

2. The device of claim 1, further comprising a second back end layer over the back end layer, the second back end layer comprising an interconnect structure.

3. The device of claim 1, further comprising a power via extending through the back end layer to one of the plurality of dies.

4. The device of claim 3, further comprising a signal via extending through the back end layer to one of the plurality of dies.

5. The device of claim 1, wherein the passive electronic structure is a resistor.

6. The device of claim 1, wherein the passive electronic structure is an inductor.

7. The device of claim 1, wherein the passive electronic structure is a capacitor.

8. The device of claim 1, wherein the seam is an air gap within the conductive material.

9. The device of claim 1, wherein the passive electronic structure comprises a first portion of the conductive material between the seam and the support structure and a second portion of the conductive material over the seam, the first portion of the conductive material having a different material structure from the second portion of the conductive material.

10. The device of claim 1, wherein the seam comprises a different chemical composition of the conductive material from a region of the conductive material above the seam.

11. The device of claim 1, wherein the passive electronic structure has a base parallel to the front side of the support structure and a height in a direction perpendicular to the front side of the support structure, and the seam is located at a height above the base in a range between 40% and 60% of the height.

12. The device of claim 1, further comprising a via coupled to the passive electronic structure and formed over the passive electronic structure.

13. The device of claim 12, wherein the passive electronic structure has a height in a direction perpendicular to the front side of the support structure, and the via has a width in a direction parallel to the front side of the support structure, the width of the via greater than the height of the passive electronic structure.

14. The device of claim 1, wherein a cross-section of the passive electronic structure has a back side parallel to the front side of the support structure and a front side parallel to the front side of the support structure, the front side of the passive electronic structure farther from the support structure than the back side of the passive electronic structure, wherein a length of the back side of the passive electronic structure is shorter than a length of the front side.

15. A wafer comprising:

a logic layer comprising a plurality of dies, one of the plurality of dies comprising a plurality of transistors; and an interconnect layer over the logic layer, the interconnect layer comprising an interconnect structure electrically coupled to one of the plurality of transistors, the interconnect layer further comprising a passive electronic device comprising a conductive material and a seam within the conductive material, the seam extending through the conductive material substantially parallel to an interface between the logic layer and the interconnect layer.

16. The wafer of claim 15, wherein the passive electronic device is a resistor or an inductor.

17. The wafer of claim 15, wherein the seam is an air gap within the conductive material.

18. The wafer of claim 15, wherein the passive electronic device comprises a first portion of the conductive material between the seam and the logic layer and a second portion of the conductive material over the seam, the first portion of the conductive material having a different material structure from the second portion of the conductive material.

19. The device of claim 1, wherein, in a cross-section through the support structure, computing logic, and a back end layer, the seam is bounded by the conductive material.

20. The wafer of claim 15, wherein, in a cross-section through the conductive material and the seam, the conductive material has a greater width than the seam.

* * * * *